US012802748B2

(12) United States Patent
Lu et al.

(10) Patent No.: US 12,802,748 B2
(45) Date of Patent: Nov. 17, 2026

(54) DYNAMIC RANDOM-ACCESS MEMORY STRUCTURE WITH HIGH SPEED AND WIDE BUS

(71) Applicant: Invention and Collaboration Laboratory, Inc., Taipei City (TW)

(72) Inventors: Chao-Chun Lu, Taipei City (TW); Chun Shiah, Hsinchu City (TW); Shih-Hsing Wang, Hsinchu (TW)

(73) Assignee: Invention and Collaboration Laboratory, Inc., Taipei City (TW)

( * ) Notice: Subject to any disclaimer, the term of this patent is extended or adjusted under 35 U.S.C. 154(b) by 105 days.

(21) Appl. No.: 18/890,799

(22) Filed: Sep. 20, 2024

(65) Prior Publication Data

US 2025/0104763 A1 Mar. 27, 2025

Related U.S. Application Data

(60) Provisional application No. 63/539,834, filed on Sep. 22, 2023.

(51) Int. Cl.

| | |
|---|---|
| ***G11C 11/4097*** | (2006.01) |
| ***G11C 11/406*** | (2006.01) |
| ***G11C 11/4076*** | (2006.01) |
| ***G11C 11/4091*** | (2006.01) |
| ***G11C 11/4093*** | (2006.01) |
| *H10B 12/00* | (2023.01) |

(52) U.S. Cl.

CPC ........ *G11C 11/4097* (2013.01); *G11C 11/406* (2013.01); *G11C 11/4076* (2013.01); *G11C 11/4091* (2013.01); *G11C 11/4093* (2013.01); *H10B 12/48* (2023.02); *H10B 12/315* (2023.02)

(58) Field of Classification Search

CPC .............. G11C 11/4097; G11C 11/406; G11C 11/4076; G11C 11/4091; G11C 11/4093; G11C 11/4096; H10B 12/315; H10B 12/48

USPC ............................................ 365/149, 189.05

See application file for complete search history.

(56) References Cited

U.S. PATENT DOCUMENTS

| | | | | |
|---|---|---|---|---|
| 6,400,626 | B1 | 6/2002 | Williams | |
| 6,426,905 | B1 * | 7/2002 | Dennard | G11C 11/4091 365/204 |
| 6,689,660 | B1 * | 2/2004 | Noble | H10B 12/34 438/242 |
| 7,002,862 | B2 * | 2/2006 | Kang | G11C 7/1006 365/207 |
| 2017/0243622 | A1 * | 8/2017 | Sandhu | G11C 7/062 |

(Continued)

*Primary Examiner* — Michael T Tran

(74) *Attorney, Agent, or Firm* — Winston Hsu

(57) ABSTRACT

A DRAM structure includes a semiconductor substrate, a plurality of DRAM cells, a Bitline, a sense amplifier, and a local wordline. The semiconductor substrate has a top surface. Each DRAM cell includes an access transistor and a storage capacitor. The Bitline has a first terminal extended along the plurality of DRAM cells to a second terminal, and the Bitline is coupled to each access transistor of the plurality of DRAM cells. The sense amplifier is coupled to the first terminal of the Bitline. The local wordline is connected to a gate terminal of the access transistor of a first DRAM cell in the plurality of DRAM cells. A refresh cycle time, a write cycle time, or a read cycle time of the DRAM structure is less than 5 ns.

10 Claims, 13 Drawing Sheets

(56) References Cited

U.S. PATENT DOCUMENTS

| | | | | |
|---|---|---|---|---|
| 2017/0365356 | A1 * | 12/2017 | Shibata | G11C 29/38 |
| 2023/0089265 | A1 | 3/2023 | Zhang | |

* cited by examiner

DYNAMIC RANDOM-ACCESS MEMORY STRUCTURE WITH HIGH SPEED AND WIDE BUS

CROSS REFERENCE TO RELATED APPLICATIONS

This application claims the benefit of U.S. Provisional Application No. 63/539,834, filed on Sep. 22, 2023. The content of the application is incorporated herein by reference.

BACKGROUND OF THE INVENTION

1. Field of the Invention

The present invention relates to a DRAM (dynamic random-access memory) structure and PSRAM (Pseudo Static Random-Access Memory) structure, and particularly to a DRAM structure which can be compatible with regular SRAM, dramatically reduce a refresh cycle time, a write cycle time, or a read cycle time.

2. Description of the Prior Art

Please refer to FIG. 1A which illustrates the conventional DRAM (dynamic random-access memory) structure, the data XIO (for example, signal ONE or signal High) will be transferred along the data input circuit DI, the global I/O path GIO, the data line sense amplifier 70, and the data line DL. Furthermore, the data will be transferred between the data line DL and the memory array 75 in which the data is stored in a corresponding storage node through the bitline BL. In the memory array 75, as shown in FIG. 1B, a sense amplifier 80 is connected to the bitline BL which is coupled to the data line DL through the bitline switch BL100. A plurality DRAM cells (such as 256, 512, or 1024 cells) are connected to one bitline BL. The bitline has a first terminal end (E1) connected to the first DRAM cell of the plurality DRAM cells and a second terminal end (E2) connected to the last DRAM cell of the plurality DRAM cells. In FIG. 1C, using one DRAM cell which includes an access transistor 11 and a storage capacitor 12 as an example, the gate of the access transistor 11 is coupled to a word-line (WL) and the sense amplifier 20 is coupled to the access transistor 11 through the bit-line (BL). The DRAM cell uses the access transistor 11 as a switch to control the charges to be stored from the bit-line (BL) into the capacitor in WRITE mode or to be transferred out to bit-line in READ mode.

In summary, a DRAM Cell-array design is shown in FIG. 1A, FIG. 1B, FIG. 1C includes (1) many DRAM cells, such as the most popular 1T1C Cell including one access transistor (threshold voltage Vth, usually around 0.7V nominal) and one storage capacitance (Cstorage, usually 17fF typical); (2) these many 1T1C cells have their Drain regions of the 1T transistors to be connected respectively on an interconnection which is named as bitline; (3) the gates of these 1T transistors are also connected respectively by an interconnection which is named as wordline. The bitline is connected to a Sense Amplifier, for example, which is a CMOS cross-couple circuits. Correspondingly there is another bitline, named as bitline-Bar which carries a complementary signal to that of bitline and is also connected to the same Sense Amplifier. Along such bitline and bitline-Bar interconnections there are other devices to be connected for performing complete bitline functions in operations, such as bitline-equalization devices for equalizing the voltage potentials as needed and Bit-switch devices for controlling signals in between bitlines to the Data I/O lines.

FIG. 1D shows the related signal waveforms during access (READ or WRITE) operations of most current DRAMs. The basic Cell access operation is described as follows: (1) At a Start phase the bitline (BL) and bitline-Bar (BLB) is normally equalized at a Half-VCC level through those bitline-equalization devices; (2) When an active READ operation starts, the wordline voltage is raised to a high voltage level such as VPP to fully turn on the access transistor; (3) then the Cell storage charges in the cell capacitor will be transferred through the access transistor to the bitline to change the voltage from the Half-VCC level, that is, there appears a small sensing voltage, delta-V about 100 mV, which is either additive above the Half-VCC level (called as initial sensing signal ONE) or subtractive below the Half-VCC level (called as initial sensing signal ZERO); (4) the magnitude of this ΔV can be calculated as:

$$\Delta V = 1/2 \times VCC \times [Cstorage/(Cstorage + Cbitline + Csenseamp + Cbitswitch + Ceq] \quad (1)$$

(5) after most charges have been transferred from the storage capacitor to the bitline, then the cross-couple sense-amplifier can be triggered on by the well-designed latch-signals to start amplify the delta-V to larger signals.

(6) To give a state-of-the-art design on the DRAM Cell array, Cstorage ~17 fF, Cbitline~27.5 fF (each bitline C per Cell~0.04 fF, thus the bitline capacitance of a bitline which is connected with 688 cells), (Csenseamp+Cbitswich+Ceq) ~11 fF, VCC~1.1 V, and as a result, ΔV~168 mV, which is quite sufficient for a successful sensing and amplification. By taking a different perspective on the design of C storage or VCC, if the minimum ΔV is required to be 100 mV, then either the minimum Cstorage can be 10 fF or the VCC can be 0.67 V.

The typical design flow is to select a Cell design, for example, either a stacked-capacitor over the access transistor (stacked C design) or a trench-capacitor connected to the transistor. Then based on the defined process integration, the cell topography can be well defined; then the bitline capacitance per cell can be defined by the capacitance from the cell topography and then the entire Cbitline can be thus defined consequently. In the conventional DRAM, the capacitance of the bitline per DRAM cell (Cbl) made by tens nm technology node (such as 15~28 nm technology node) is around $40\times10^{-3}$ fF by assuming connecting 688 or 512 cells on a bitline, and Table 1 shows a typical example of the capacitances related the bitline capacitance.

TABLE 1

| Components | $\times10^{-3}fF$ |
|---|---|
| bit line to bit line | ~2 |
| bit line to S-SN (Self storage node) | ~13 |
| bit line to O-SN (Other storage nodes) | ~12 |
| bit line to word line | ~12 |
| bit line to substrate | ~1 |
| Total | 40 |

Because the greater the capacitance of the bit line (or the capacitance of the word line) per cell, related to a bit line (or a word line) is, the fewer the number of DRAM cells connected to the bit line (or the word line) can be, how to reduce the total capacitance related to the bit line (or the word line) has become an important issue for a designer of the DRAM cells.

SUMMARY OF THE INVENTION

An embodiment of the present invention provides a DRAM structure. The DRAM structure includes a semiconductor substrate, a plurality of DRAM cells, a Bitline, a sense amplifier, and a local wordline. The semiconductor substrate has a top surface. Each DRAM cell includes an access transistor and a storage capacitor. The Bitline has a first terminal extended along the plurality of DRAM cells to a second terminal, and the Bitline is coupled to each access transistor of the plurality of DRAM cells. The sense amplifier is coupled to the first terminal of the Bitline. The local wordline is connected to a gate terminal of the access transistor of a first DRAM cell in the plurality of DRAM cells. A refresh cycle time, a write cycle time, or a read cycle time of the DRAM structure is less than 5 ns.

According to one aspect of the invention, the refresh cycle time, the write cycle time, or the read cycle time is less than 3 ns.

According to one aspect of the invention, the Bitline is under the top surface of the semiconductor substrate.

Another embodiment of the present invention provides a PSRAM structure. The PSRAM structure includes a semiconductor substrate, a plurality of DRAM cells, a Bitline, a sense amplifier, and a local wordline. The semiconductor substrate has a top surface. Each DRAM cell includes an access transistor and a storage capacitor. The Bitline has a first terminal extended along the plurality of DRAM cells to a second terminal, and the Bitline is coupled to each access transistor of the plurality of DRAM cells. The sense amplifier is coupled to the first terminal of the Bitline. The local wordline is connected to a gate terminal of the access transistor of a first DRAM cell in the plurality of DRAM cells. A refresh cycle time of the PSRAM structure is less than 5 ns.

According to one aspect of the invention, the refresh cycle time is less than 3 ns.

Another embodiment of the present invention provides a DRAM structure. The DRAM structure includes a memory bank, an I/O data bus, and a plurality of data line sensing amplifiers. The plurality of data line sensing amplifiers are configured to parallelly output a plurality of data. A width of the I/O data bus is equal to a width of the plurality of data parallelly outputted by the plurality of data line sensing amplifiers.

According to one aspect of the invention, the width of the I/O data bus is programmable.

According to one aspect of the invention, the width of the I/O data bus is 128~1024bits.

According to one aspect of the invention, no serial-to-parallel circuit and/or parallel-to-serial circuit is between the I/O data bus and the plurality of data line sensing amplifiers.

According to one aspect of the invention, the memory bank includes a plurality of DRAM cells, each DRAM cell includes an access transistor and a storage capacitor, and the DRAM structure further includes a semiconductor substrate, a Bitline, a bitline sense amplifier, and a local wordline. The semiconductor substrate has a top surface. The Bitline has a first terminal extended along the plurality of DRAM cells to a second terminal, and the Bitline is coupled to each access transistor of the plurality of DRAM cells. The bitline sense amplifier is coupled to the first terminal of the Bitline. The local Wordline is connected to a Gate terminal of the access transistor of a first DRAM cell in the plurality of DRAM cells. The Bitline is under the top surface of the semiconductor substrate.

These and other objectives of the present invention will no doubt become obvious to those of ordinary skill in the art after reading the following detailed description of the preferred embodiment that is illustrated in the various figures and drawings.

DETAILED DESCRIPTION

A new Thunder Array DRAM cell with Underground Bit-Lines (UGBL) surrounded by insulators has been disclosed (U.S. patent application Ser. No. 18/221,898; Title: SEMICONDUCTOR MEMORY STRUCTURE; filed on Jul. 14, 2023. The whole content of such application is incorporated by reference herein), and the Cbitline per cell of the new DRAM cell structure could be lower than $30\times10^{-3}$ fF, such as $10\times10^{-3}$ fF~$20\times10^{-3}$ fF. For example, in the proposed DRAM structure having bitline with very low capacitance, the capacitance of the bitline per DRAM cell with the following components in Table 2 is around ~$10.06\times10^{-3}$ fF which is approximate to ¼ of the capacitance of the bitline per DRAM cell in the referenced conventional DRAM structure ($40\times10^{-3}$ fF). One exemplary figure of the Thunder Array DRAM cell with UGBL (the capacitor is not shown) is shown in FIG. 2.

Figure 1A:
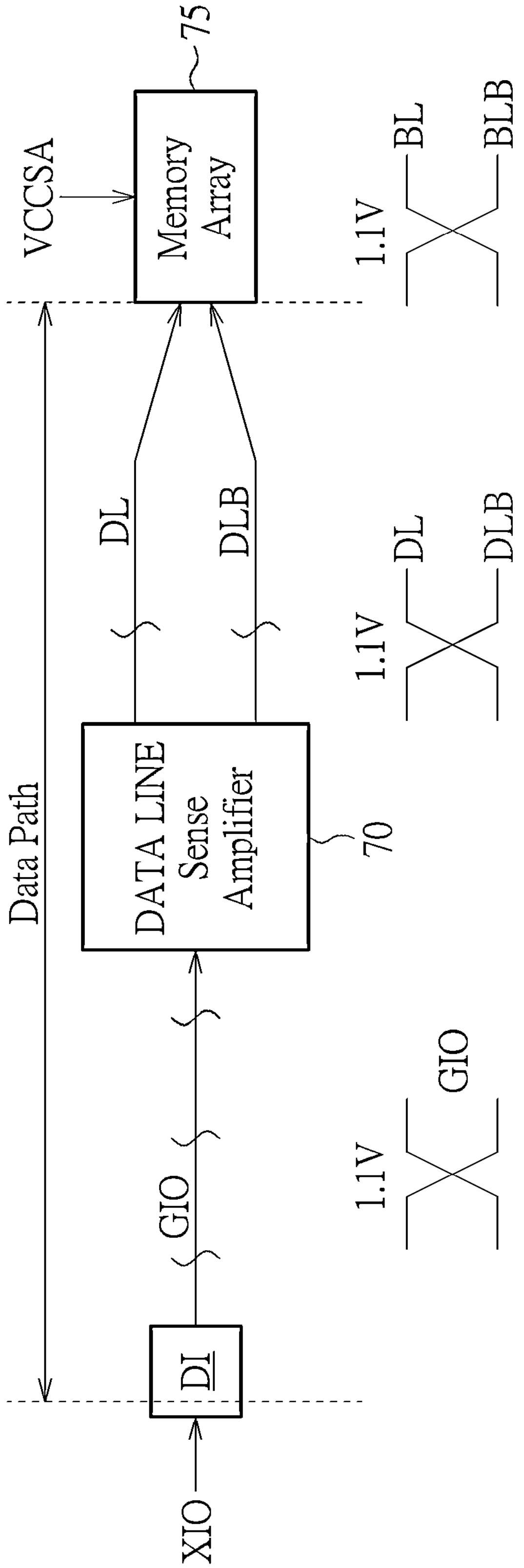
FIG. 1A PRIOR ART
FIG. 1A illustrates a voltage swing on the data path during a write operation for a conventional lower power DRAM.
Figure 1B:
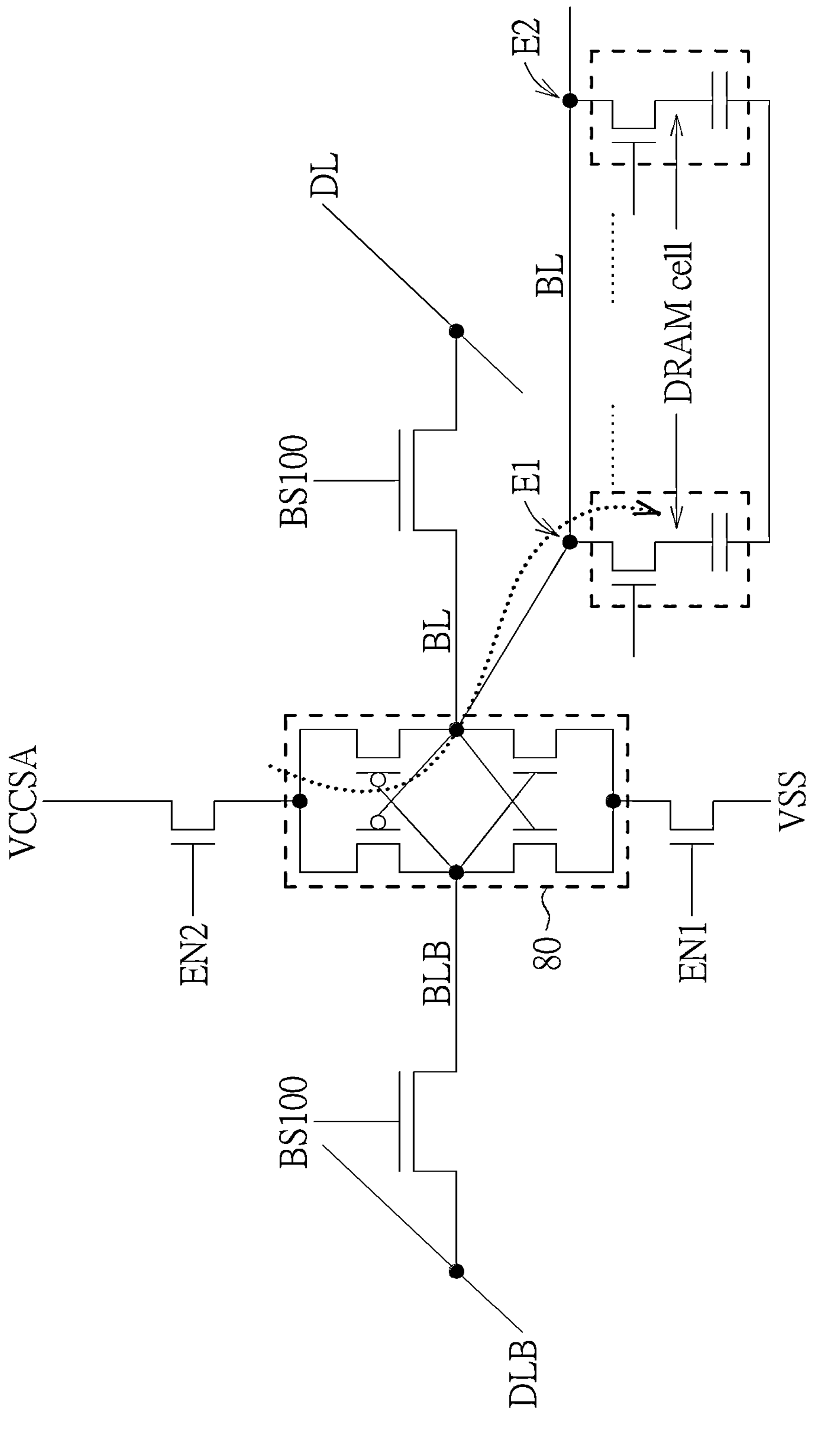
FIG. 1B PRIOR ART
FIG. 1B illustrates a schematic circuit for the sense amplifier selectively coupled to two separate voltage sources during WRITE operation of the DRAM cell.
Figure 1C:
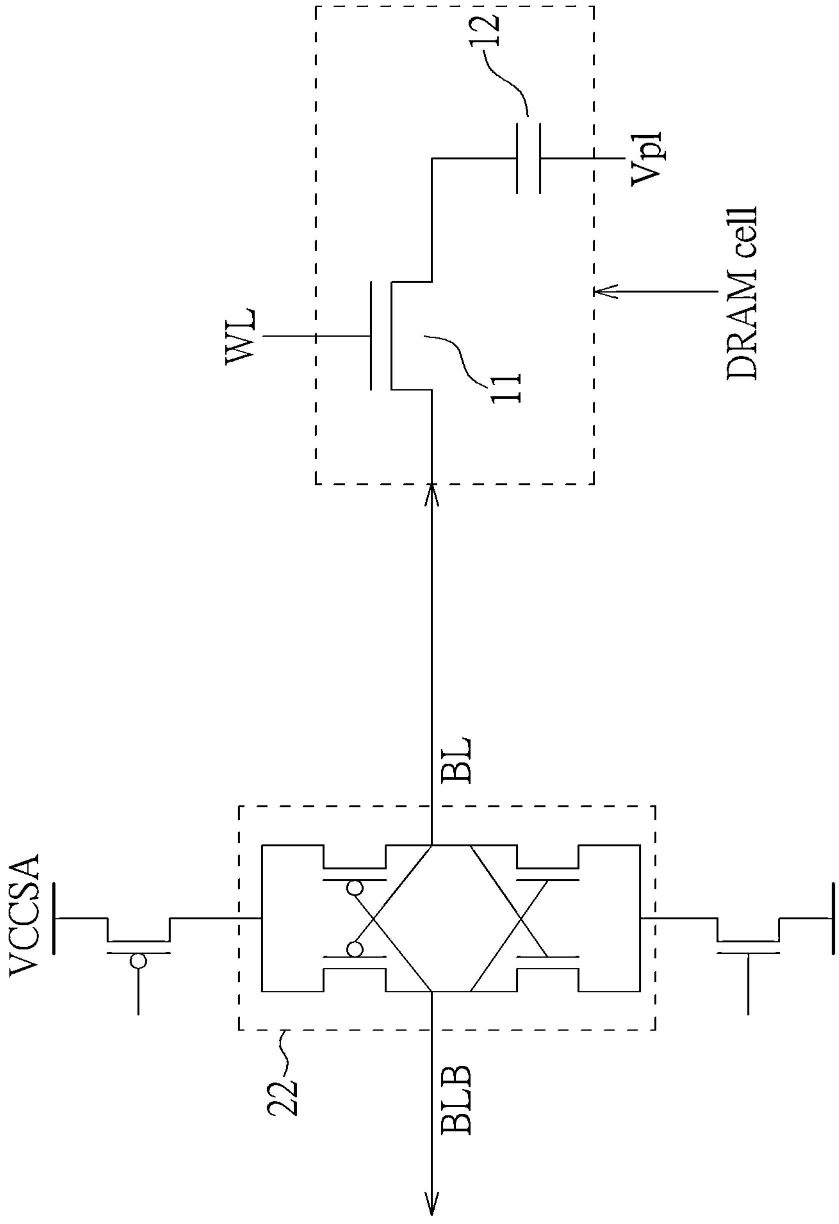
FIG. 1C PRIOR ART
FIG. 1C illustrates commonly used design of the DRAM cell.
Figure 1D:
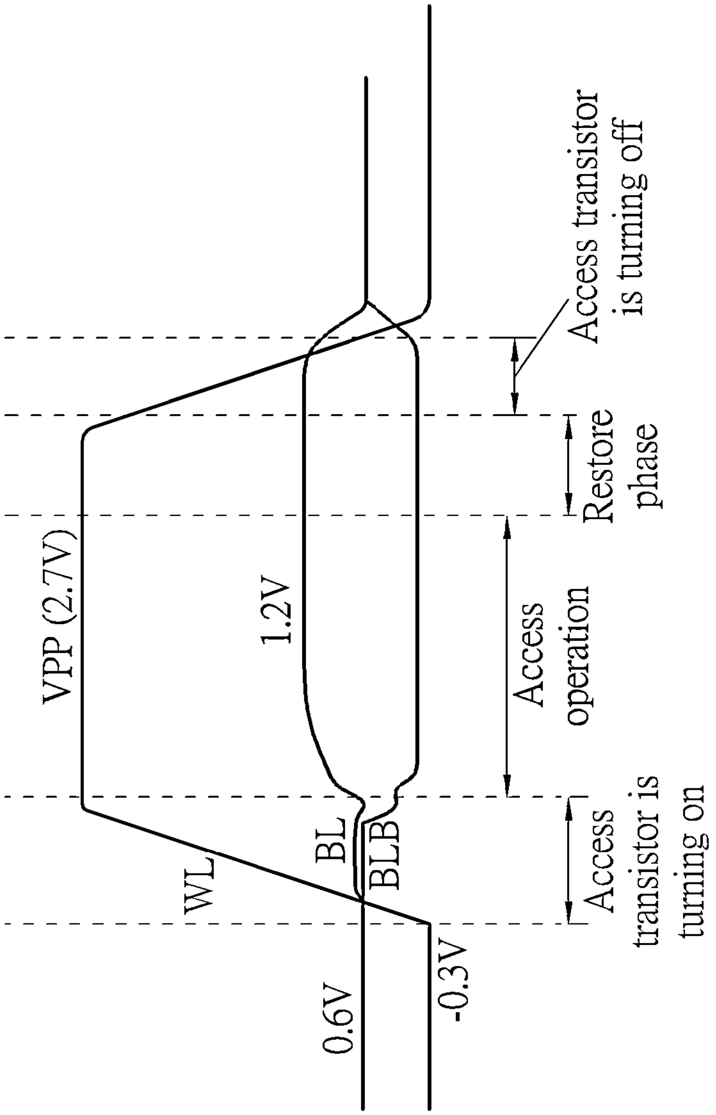
FIG. 1D PRIOR ART
FIG. 1D illustrates the related signal waveforms during access (READ or WRITE) operation of most current DRAMs.
Figure 2:
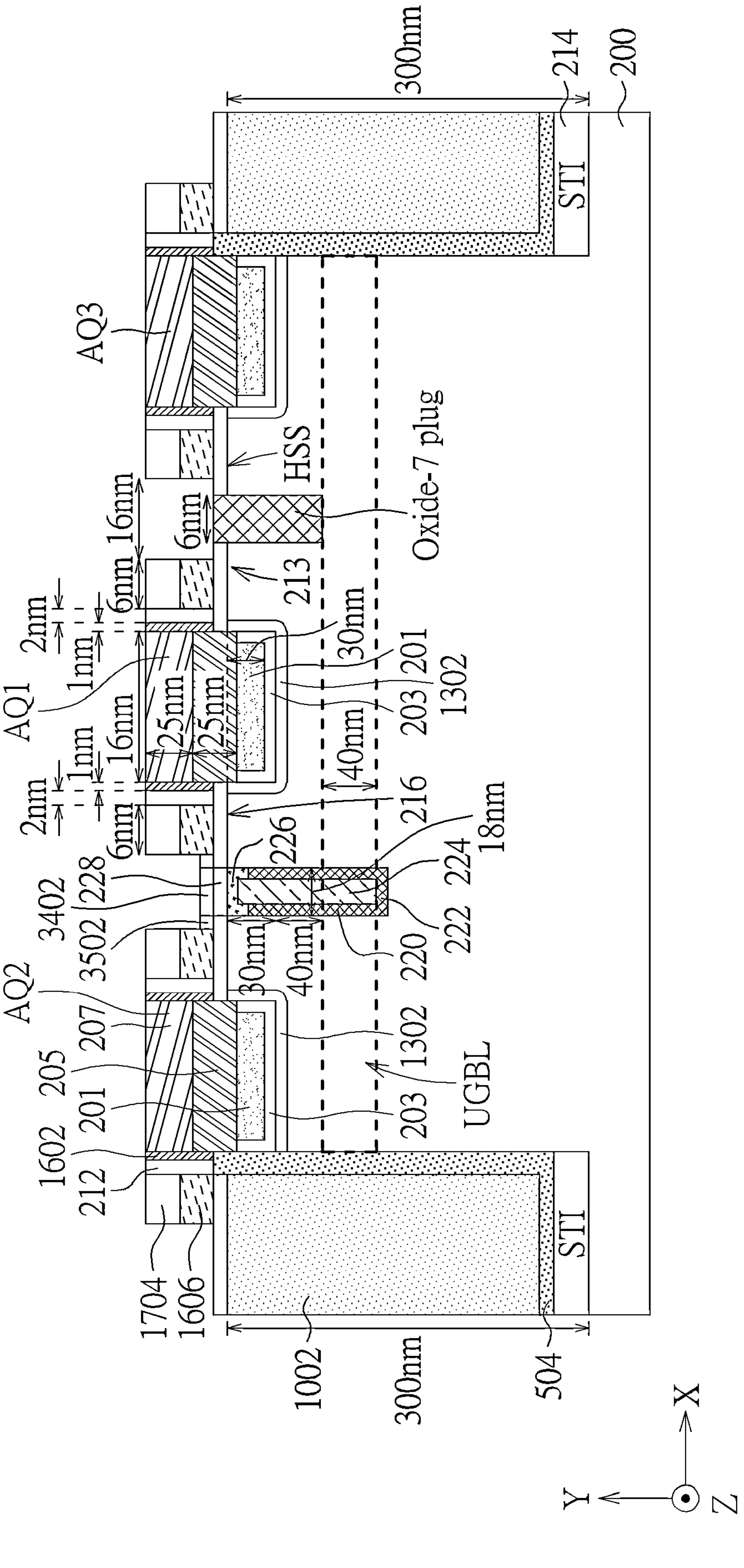
FIG. 2 illustrates the relationship between the DRAM cell and the underground bit line (UGBL).

As shown in FIG. 2, the access transistor of the new DRAM cell includes a recess gate 201, a drain 216 and a source 213. The recess gate (e.g., made of Tungsten (W), other metal, or poly-silicon) 201 could be under a top surface or horizontal silicon surface (HSS) of a semiconductor (such as silicon) substrate 200 and has a thickness smaller than and almost equal to 30 nm, and a word line (made of Tungsten or other metal) connected to the recess gate 201 propagates along the Z direction. There is ~2 nm high-k (Hi-K) insulator layer (or 5 nm oxide layer) 203 as gate dielectric layer surrounding the recess gate 201. Above the recess gate 201, there are ~25 nm nitride layer 205 and ~25 nm oxide layer 207 as a composite cap layer which has a width of ~16 nm. Around sidewalls of the cap layer, there are ~ 1 nm nitride layer 209 and ~2 nm oxide layer 212 as spacers. The source 213 with a width of ~9 nm and the drain 216 with a width of ~9 nm are located on two sides (in X-direction) of the recess gate 201.

Next to the drain 216, there is a first hole 220 with width around 18 nm and height around 110 nm~120 nm. An oxide layer 222 covers a bottom and sidewalls of the first hole 220, and a connecting plug (such as Tungsten, or other metal, or ploy-silicon) 224 is deposited within the first hole 220 and surrounded by the oxide layer 222. The thickness of the oxide layer 222 covering the sidewalls of the first hole 220 could be 2~6 nm, such as 4 nm. Between the top surface HSS of the semiconductor substrate 200 and the connecting plug 224, there is heavily doped material (such as n+ silicon) 226 covering the connecting plug 224, and the heavily doped material 226 is electrically connected to the connecting plug 224 and the drain 216. On a top of the heavily doped material 226, there is an oxide layer 228 for isolating the drain 216 from the storage capacitor.

Under ~70 nm from the top surface HSS of the semiconductor substrate 200, an underground bit line ("UGBL") is formed and connected to the connecting plug 224. The height of the bit line UGBL is ~40 nm and propagates along the X-direction, as marked by dash rectangle shown in FIG. 2. The bit line UGBL is fully isolated from the semiconductor substrate 200, and a first side surface of the bit line UGBL is isolated from the semiconductor substrate 200 by a first isolating material (such as $SiO_2$), and a second side surface of the bit line UGBL opposite to the first side surface is isolated from the semiconductor substrate 200 by a second isolating material (such as SiOCN or $Si_3N_4$). In addition, AQ1, AQ2, AQ3 represent access transistors.

In Table 2, the capacitance of the bitline per DRAM cell according to the present invention could be even lower by further modification of the proposed DRAM structure.

TABLE 2

| Components | $\times 10^{-3}F$ |
|---|---|
| bit line to bit line | ~2.6 |
| bit line to S-SN (Self storage node) | ~0.38 |
| bit line to O-SN (Other storage nodes) | ~0.38 |
| bit line to word line | ~1.7 |
| bit line to substrate | ~5 |
| Total | 10.06 |

Similarly, a Cwordline per DRAM cell (or Cwl) for the proposed DRAM structure in Table 3 is around $5.4\times10^{-3}$fF which is approximate to 1/15 of the capacitance of the wordline per DRAM cell in the referenced conventional DRAM structure ($79\times10^{-3}$fF).

TABLE 3

| Components | Conventional ($\times10^{-3}$ fF) | The present invention ($\times10^{-3}$ fF) |
|---|---|---|
| word line to word line | ~1 | 0.63 |
| word line to S-SN (Self storage node) | ~4.9 | 0.6 |
| word line to O-SN (Other storage nodes ) | ~0.1 | 0.048 |
| word line to bit line | ~13 | 1.72 |
| word line to substrate | ~60 | 2.4 |
| Total | 79 | ~5.4 |

Furthermore, to reduce the resistance of the UGBL, the conventional conductive material of small grain size Tungsten (W) for bitline could be replaced by large grain size Tungsten (W), and the resistivity could be reduced from 350 to 125Ω/μm (at bitline with width 20 nm and height 80 nm); furthermore, large grain size Tungsten (W) could be replaced by Ruthenium, and the resistivity could be reduced from 125 to 75Ω/μm, as shown in the following table 4 (2021 IMEC at IEDM: Buried Power Rail Metal exploration towards the 1 nm Node). Thus, the resistivity could be improved from 350 to 75Ω/μm. Similarly, to reduce the resistance of the wordline, the conventional small grain size Tungsten for wordline could also be changed to Ru, and the resistivity thereof will be improved from 350 to 75Ω/μm.

TABLE 4

| | W OLD | W Type B | Ru |
|---|---|---|---|
| Resistivity (Ω/μm) | 350 | 125 | 75 |

According to the above-mentioned, the new DRAM array (called Thunder Array) of the present invention effectively reduces capacitance and resistance of the bitline and wordline (or the local wordline). The bitline resistance/μm of the proposed Thunder Array at least could be reduced to ⅓~¼ and the bitline capacitance/μm is also reduced to ⅓~¼, thus, the RC time constant for the bitline is reduced to 1/9~1/16. Moreover, the wordline resistance/μm of the proposed Thunder Array could be at least reduced to ½~⅓, and the wordline capacitance/μm is also reduced to 0.068, taking example of reduction to ⅓~¼, the RC time constant for the wordline could be reduced to ⅙~1/12. For example, according to 6 sigma calculation, RC Time Constant of the local word line is around 1.83 ns~Ons (based on RC Time Constant of the local word line is reduced to ⅙ of the RC time constant of the conventional DDR3/DDR4 DRAM) and RC Time Constant of the Bit Line is around 0.211 ns~Ons (based on RC Time Constant of the local word line is reduced to 1/9 of the RC time constant of the conventional DDR3/DDR4 DRAM)

Since the RC time constant for the bitline of the Thunder Array is reduced to 1/9~1/16, the small signal develop voltage could be improved about 2~3 times, and the refresh time could be improved 2~3 times as well. Since the RC time constant for the local wordline (LWL) of the Thunder Array is reduced to ⅙~1/12, the rising time of a voltage signal in LWL could be reduced from 11 ns to 0.5~0.9 ns (or less than 4 ns, such as less than 2 ns), and the falling time of a voltage signal in LWL could also be reduced from 11 ns to 0.5~0.9 ns (or less than 4 ns, such as less than 2 ns).

Figure 3:
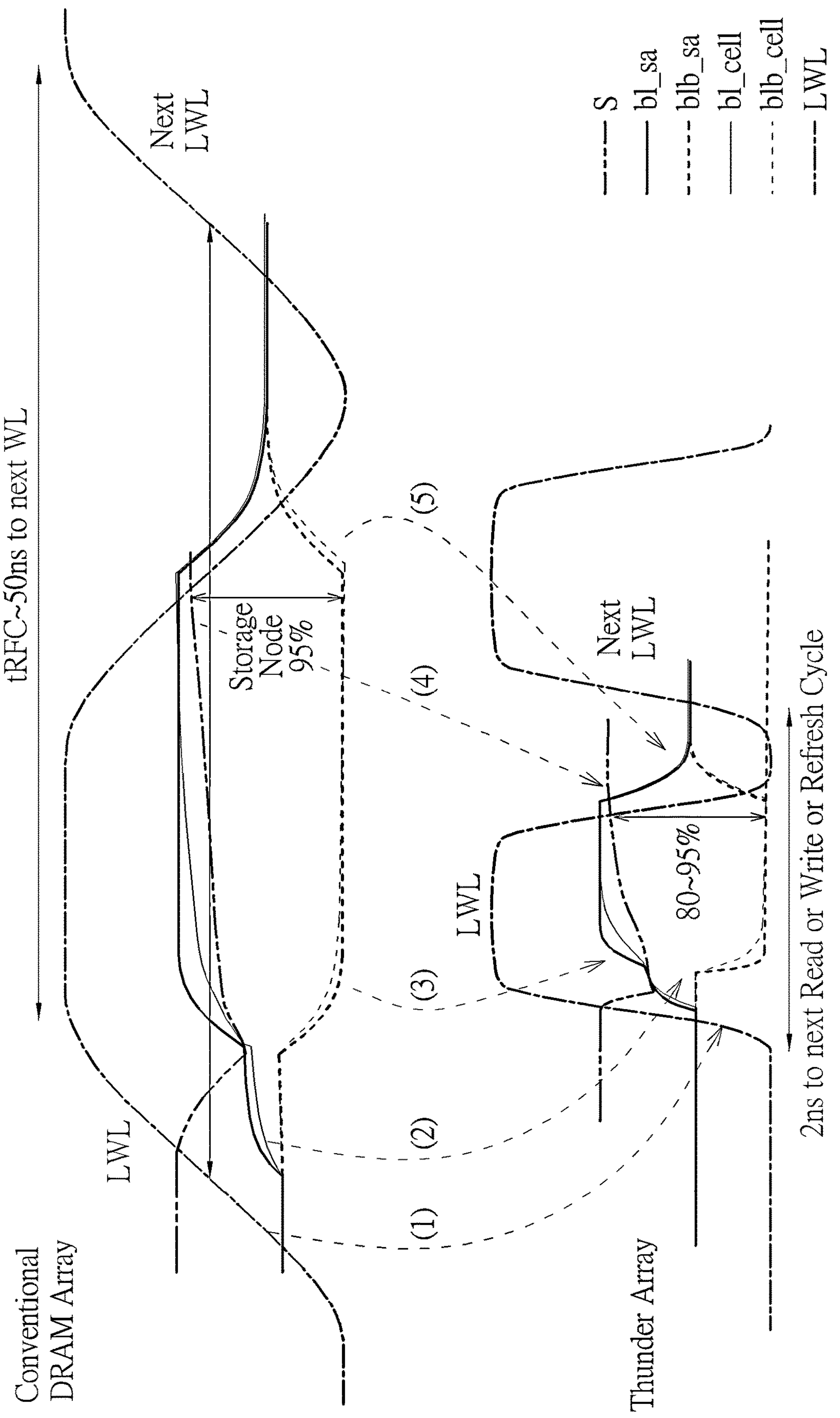
FIG. 3 is a diagram illustrating the refresh speed comparison between the conventional DRAM array and the Thunder Array.

Please refer to FIG. 3, wherein FIG. 3 is a diagram illustrating the refresh speed comparison between conventional DRAM array and the Thunder Array. As shown in FIG. 3:

1. The rising time or falling time (or slope) of the local word line (LWL) signal curve is improved by RC time constant of the local word line (shown in (1) of FIG. 3).
2. The small signal developed speed and developed voltage is improved by the RC time constant of the bit line and cell device of the Thunder Array, such as the W/L ratio of the access transistor and/or Ion current (shown in (2) of FIG. 3).
3. Sensing speed is improved by RC time constant of the bit line (shown in (3) of FIG. 3).
4. Restore speed is improved by cell device of the Thunder Array (shown in (4) of FIG. 3), wherein as shown in FIG. 3, in the simulation result of the Thunder Array, time for (1), (2), (3) and (4) is approximate 2 ns.
5. Equalization speed is improved by RC time constant of the local WL (LWL) and RC time constant of the bit line (shown in (5) of FIG. 3), wherein in the simulation result of the Thunder Array regarding the period for the LWL from 100% falling to the level when equalization of DRAM is stable or OK is approximate 0.65 ns.

Thus, the refresh cycle time could be improved from 50 ns (conventional DRAM) to approximately 2~5 ns (or 2.65~5 ns), depending on the size of the Thunder Array (such as 512×512 or 1024×1024 cells). The curve S represents the voltage of Storage Node, and the curves bl_cell and blb_cell represent the voltage of the Bit line of the memory cell and the voltage of the Bit line Bar of the memory cell, respectively. In addition, the curves bl_sa and blb_sa represent the voltage of the Bit line of the sensing amplifier and the voltage of the Bit line Bar of the sensing amplifier, respectively. Such improvement could be applied to Pseudo SRAM (Pseudo Static Random-Access Memory, PSRAM) as well. PSRAM usually requires a trow1 timing slot when a read or write command issued. The trow1 timing slot is to prevent DRAM internal self-refresh requests hits the external command simultaneously. Once it is hit, the DRAM chip can do self-refresh first, then execute the external read or write command. The trow1 timing slot is the refresh cycle time of DRAM cells which is usually very long (such as >50 ns), such that the performance of the PSRAM can be damaged by trow1 timing slot. Since the Thunder Array DRAM has extremely short refresh cycle time (Ex. 2 ns), using Thunder Array to design PSRAM requires only 2 ns trow1 timing slot and has big improvements.

Figure 4:
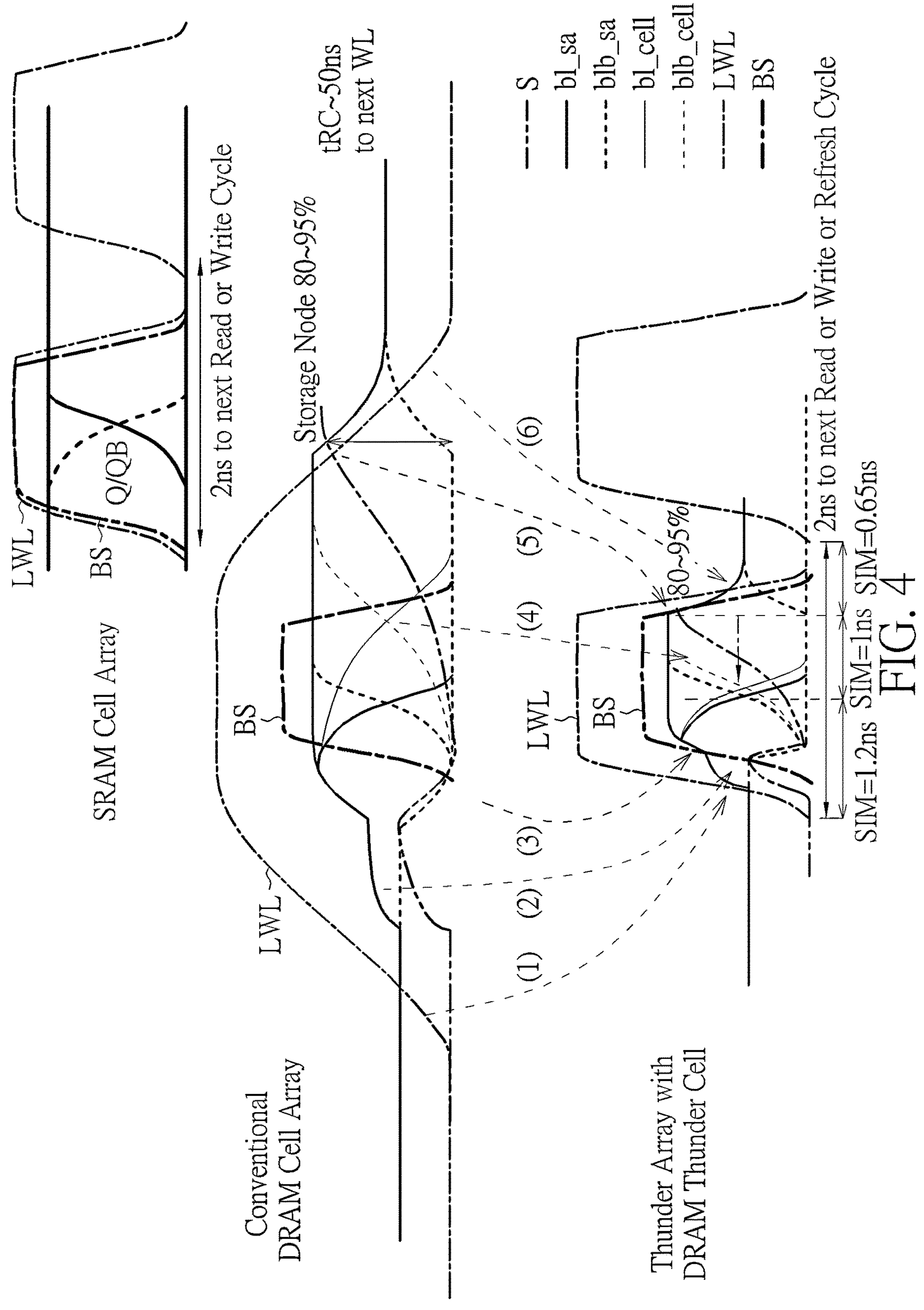
FIG. 4 is a diagram illustrating the write speed comparison between the conventional DRAM array, the Thunder Array and the SRAM array.

Moreover, please refer to FIG. 4, wherein FIG. 4 is a diagram illustrating the write speed comparison between conventional DRAM array, the Thunder Array and the SRAM array. As shown in FIG. 4:

1. The rising/falling time (or slope) of the local word line (LWL) signal curve is improved by RC time constant of the local WL (shown in (1) of FIG. 4).
2. The small signal developed speed and developed voltage is improved by the RC time constant of the bit line and cell device of the Thunder Array, such as the W/L ratio of the access transistor and/or Ion current (shown in (2) of FIG. 4).
3. Sensing speed is improved by RC time constant of the bit line (shown in (3) of FIG. 4), wherein in the simulation result of the Thunder Array, time for (1), (2) and (3) is approximate 1.2 ns.
4. BL_Cell Write speed is improved by RC time constant of the bit line (shown in (4) of FIG. 4). 5. Restore speed is improved by cell device of the Thunder Array (shown in (5) of FIG. 4), wherein, the period from the flip of the bl_sa and blb_sa curves to 80~95% recovery of the Storage Node is around Ins, as shown in FIG. 4.
6. Equalization speed is improved by RC time constant of the local WL and RC time constant of the bit line (shown in (6) of FIG. 4), wherein in the simulation result of the Thunder Array regarding the period for the LWL from 100% falling to the level when equalization of DRAM is stable or OK is approximate 0.65 ns.

Thus, the write cycle time could be improved to 2~5 ns (or 2.85~5 ns) as well, depending on the size of the Thunder Array (such as 512×512 or 1024×1024 cells). In addition, the curve "BS" represents the voltage of the control signal of the bit switch and "Q/QB" shown in the top figure of FIG. 5 represents data and "SIM" represents simulation results.

Figure 5:
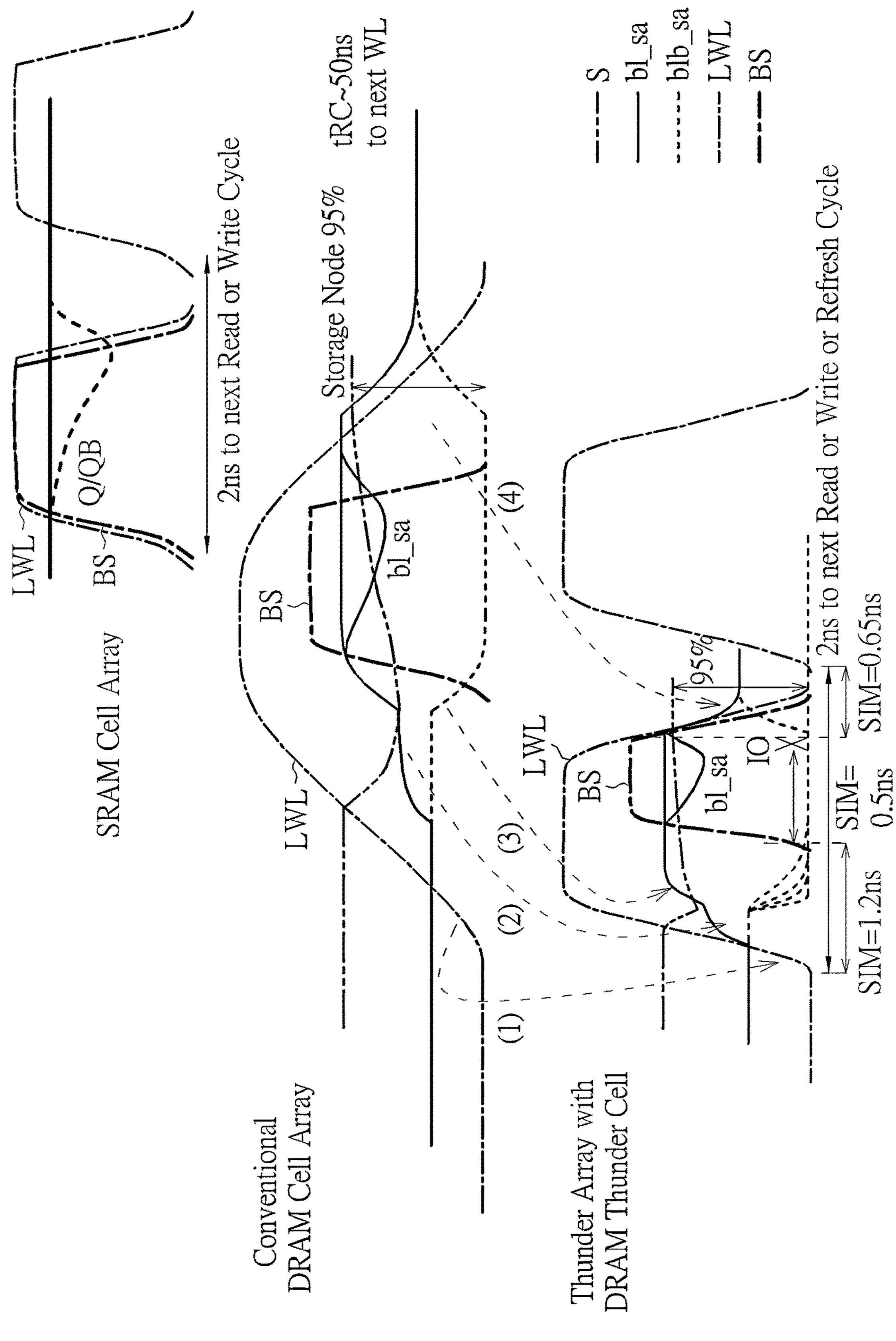
FIG. 5 is a diagram illustrating the read speed comparison between the conventional DRAM array, the Thunder Array and the SRAM array.

Moreover, please refer to FIG. 5, wherein FIG. 5 is a diagram illustrating the read speed comparison between conventional DRAM array, the Thunder Array and the SRAM array. As shown in FIG. 5:

1. The rising/falling time (or slope) of the local word line (WL) signal curve is improved by RC time constant of the local WL (shown in (1) of FIG. 5).
2. The small signal developed speed and developed voltage is improved by the RC time constant of the bit line and cell device of the Thunder Array, such as the W/L ratio of the access transistor and/or Ion current (shown in (2) of FIG. 5), wherein in the simulation result of the Thunder Array, time for (1), (2) is approximate 1.2 ns.
3. Sensing speed is improved by RC time constant of the bit line, as marked by (3) in FIG. 5. Wherein in the simulation result of the Thunder Array regarding the period from "BS on" (that is, bit switch turn-on) to "IO" (that is, data to data line or global I/O line) is approximate 0.5 ns.
4. Equalization speed is improved by RC time constant of the local WL and RC time constant of the bit line (shown in (4) of FIG. 5), wherein in the simulation result of the Thunder Array regarding the period for the LWL from 100% falling to the level when equalization of DRAM is stable or OK is approximate 0.65 ns.

Thus, the read cycle time could be also improved to 2~5 ns (or 2.35~5 ns), depending on the size of the Thunder Array (such as 512×512 or 1024×1024 cells).

Figure 6:
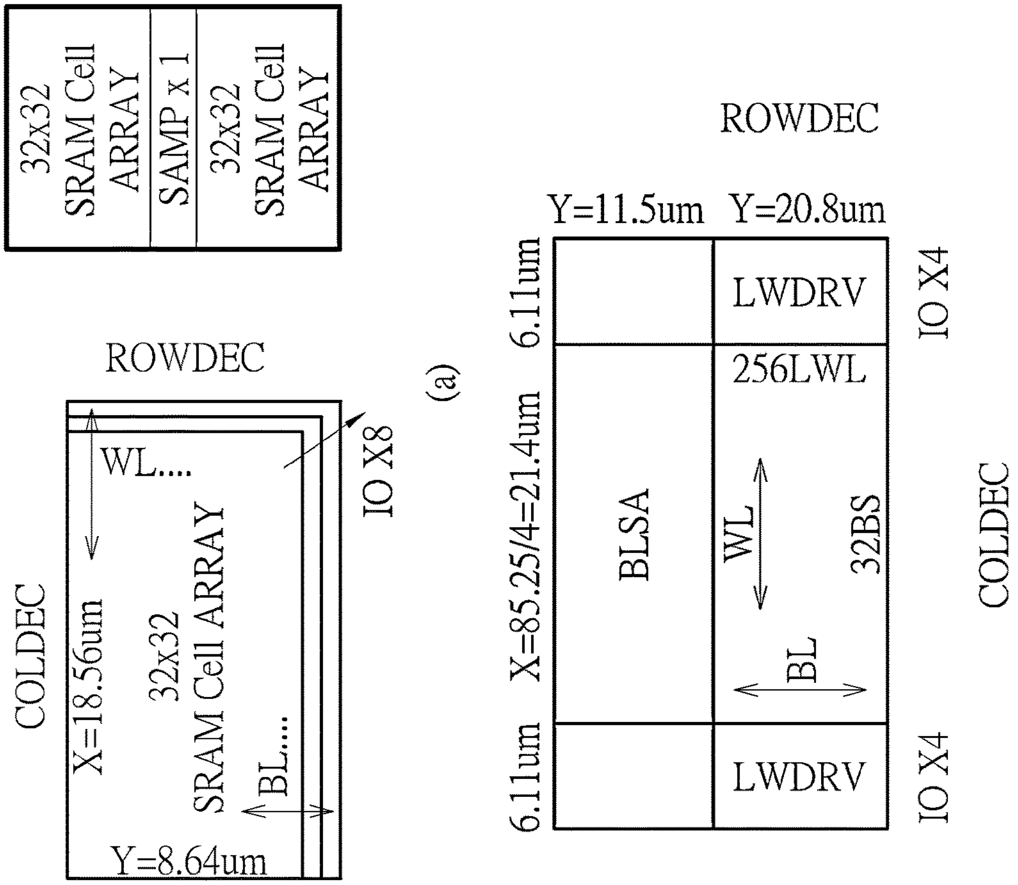
FIG. 6 is a diagram illustrating the area comparison between the Thunder Array and the 6T SRAM array.

Therefore, the operation speed of the Thunder Array is faster than that of the conventional DRAM array, even compatible with that of commercial SRAM. To be mentioned, as shown in FIG. 6(*a*), the area size of 1 KB (32×32 array) 6T SRAM based on conventional 28 nm Technology is around 1283 $um^2$ (X=0.58*32=18.56 um; Y=0.27*32=8.64 um; I/O pins=8). However, as shown in FIG. 6(*b*), based on the Thunder Array, the area size of 1 KB Thunder DRAM based on conventional 25 nm Technology is just around 116 $um^2$ according to equation (1):

$$X = 21.4 + 6.11 \sim 28\ um \tag{1}$$

$$Y = 11.5 + 20.8 \sim 33\ um$$

$$X * Y = 924\ um^2 @\ \text{ROW} = 256,\ COL = 32,\ IO = 8\ (8KByte)$$

$$1KB\ \text{Thunder}\ DRAM\ \text{Area 25 nm Technology} = 924/8 = 116\ um^2$$

Therefore, 1283 $um^2$ (6T SRAM) vs. 116 $um^2$ (Thunder Array DRAM)=11X (Improvement using Thunder Array DRAM), wherein, in FIG. 6, "COLDEC" represents column decoder, "ROWDEC" represents row decoder, "BL" represents bit line, "IO" represents input/output, "BLSA" represents bit line sensing amplifier, "LWDRV" represents local word line driver, "WL" represents word line, "SAMP" represents sensing amplifier, and "BS" represents bit switch.

Figure 7:
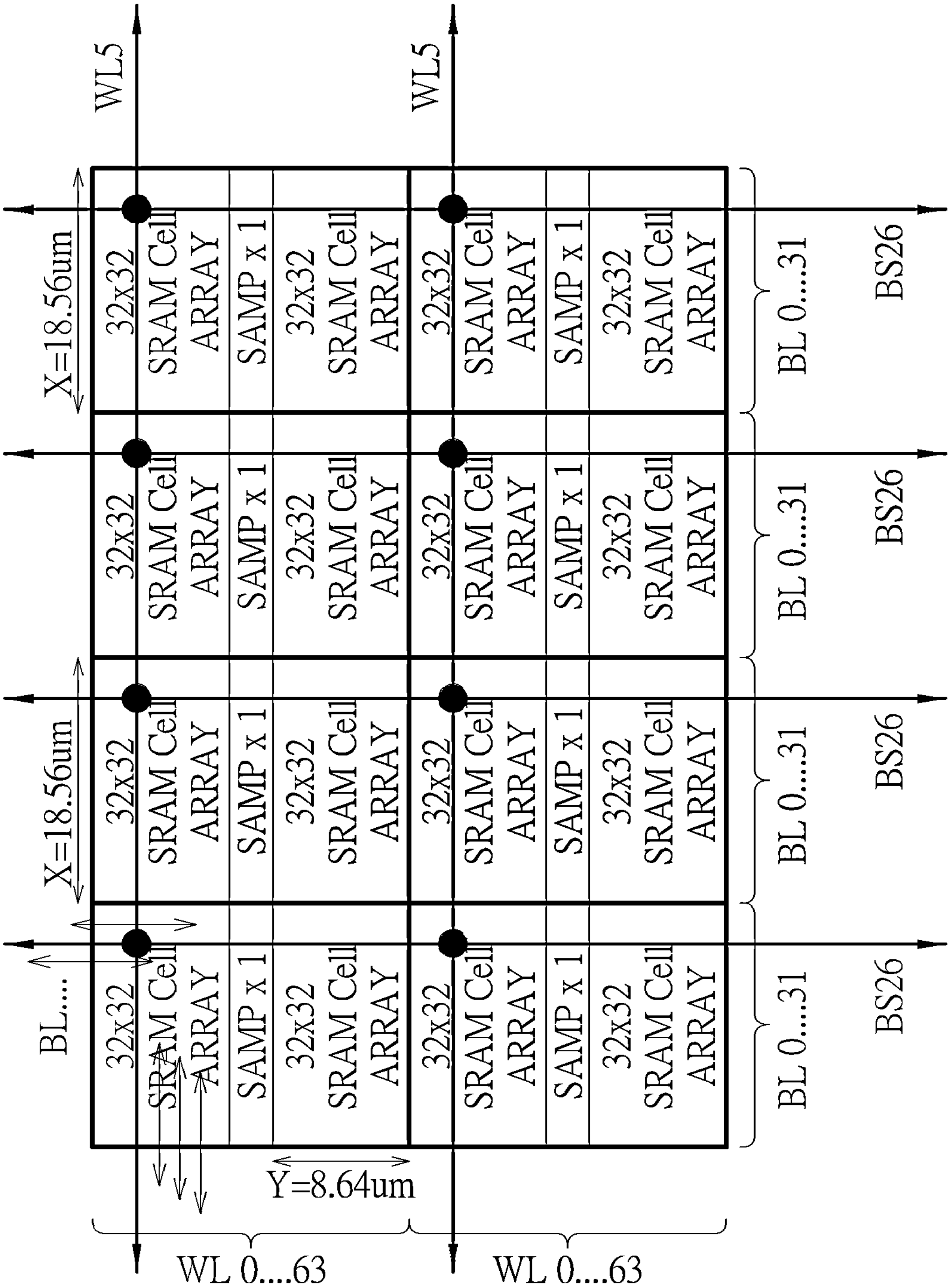
FIG. 7 PRIOR ART
FIG. 7 is a diagram illustrating a 2 KB (64×32 array) 6T SRAM based on conventional 28 nm Technology.

Please refer to FIG. 7, wherein FIG. 7 is a diagram illustrating a 2 KB (64×32 array) 6T SRAM based on conventional 28 nm Technology. As shown in FIG. 7, it is very clear that an area of the 2 KB (64×32 array) 6T SRAM based on conventional 28 nm Technology is around 2×1283 $um^2$ which is very large.

Figure 8:
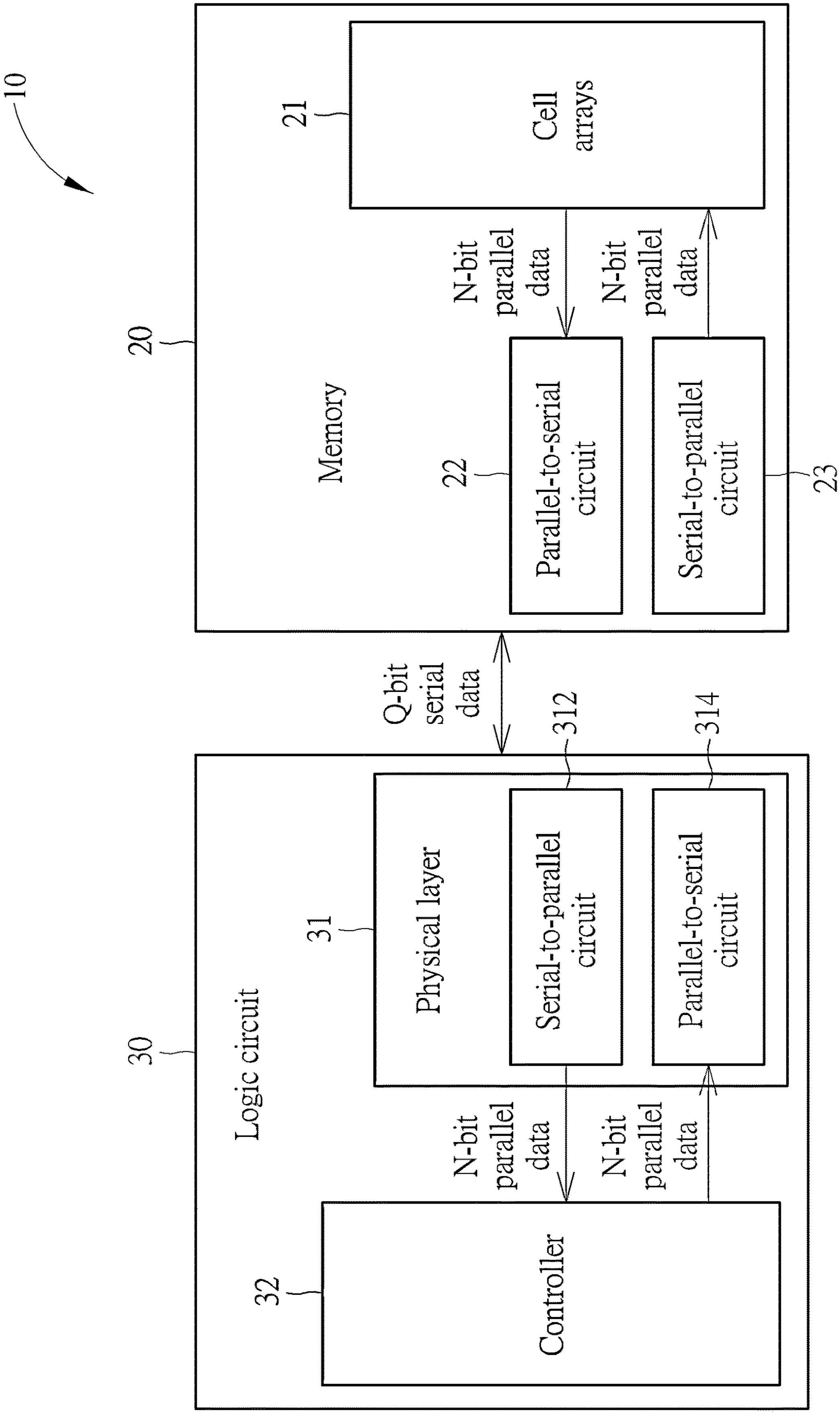
FIG. 8 PRIOR ART
FIG. 8 is a diagram illustrating a memory system according to the prior art.

Additionally, the Thunder Array of the present invention can have wide I/O bus, such as 128~1024 bits. In conventional the memory system 10 (FIG. 8), it includes a conventional memory 20 and a logic circuit 30, wherein the conventional memory 20 is a conventional dynamic random access memory (DRAM). The memory 20 includes cell arrays 21, a parallel-to-serial circuit 22, and a serial-to-parallel circuit 23; the logic circuit 30 includes a physical layer (PHY) 31 and a controller 32, and the physical layer 31 also includes a serial-to-parallel circuit 312, and a parallel-to-serial circuit 314. In addition, of course, the logic circuit 30 further includes other functional circuits (not shown in FIG. 8), wherein the other functional circuits can include central processing units (CPUs), digital signal processors (DSPs), peripheral interfaces, and so on. When the logic circuit 30 writes data into the memory 20, the parallel-to-serial circuit 314 can receive the data (e.g. N-bit data) from the controller 32 in parallel, convert the N-bit data into groups of Q-bit data, wherein Q is less than N), and transmit the groups of Q-bit data to the serial-to-parallel circuit 23; the serial-to-parallel circuit 23 can receive the groups of Q-bit data from the parallel-to-serial circuit 314, convert groups of Q-bit data into the N-bit data, and transmit the N-bit data to the cell arrays 21 in parallel. In addition, when the logic circuit 30 reads the data from the memory 20, the parallel-to-serial circuit 22 can receive the data (e.g. the N-bit data) from the cell arrays 21 in parallel, convert the N-bit data into the groups of Q-bit data, and transmit the groups of Q-bit data to the serial-to-parallel circuit 312; the serial-to-parallel circuit 312 can receive the groups of Q-bit data from the parallel-to-serial circuit 22, convert the groups of Q-bit data into the N-bit data, and transmit the N-bit data to the controller 32 in parallel. The above-mentioned serial-to-parallel circuit 23 and the parallel-to-serial circuit 22 of the DRAM would limit I/O width, cost extra power, transmission latencies, and die areas, result in low efficiencies of the memory system 10.

Figure 9:
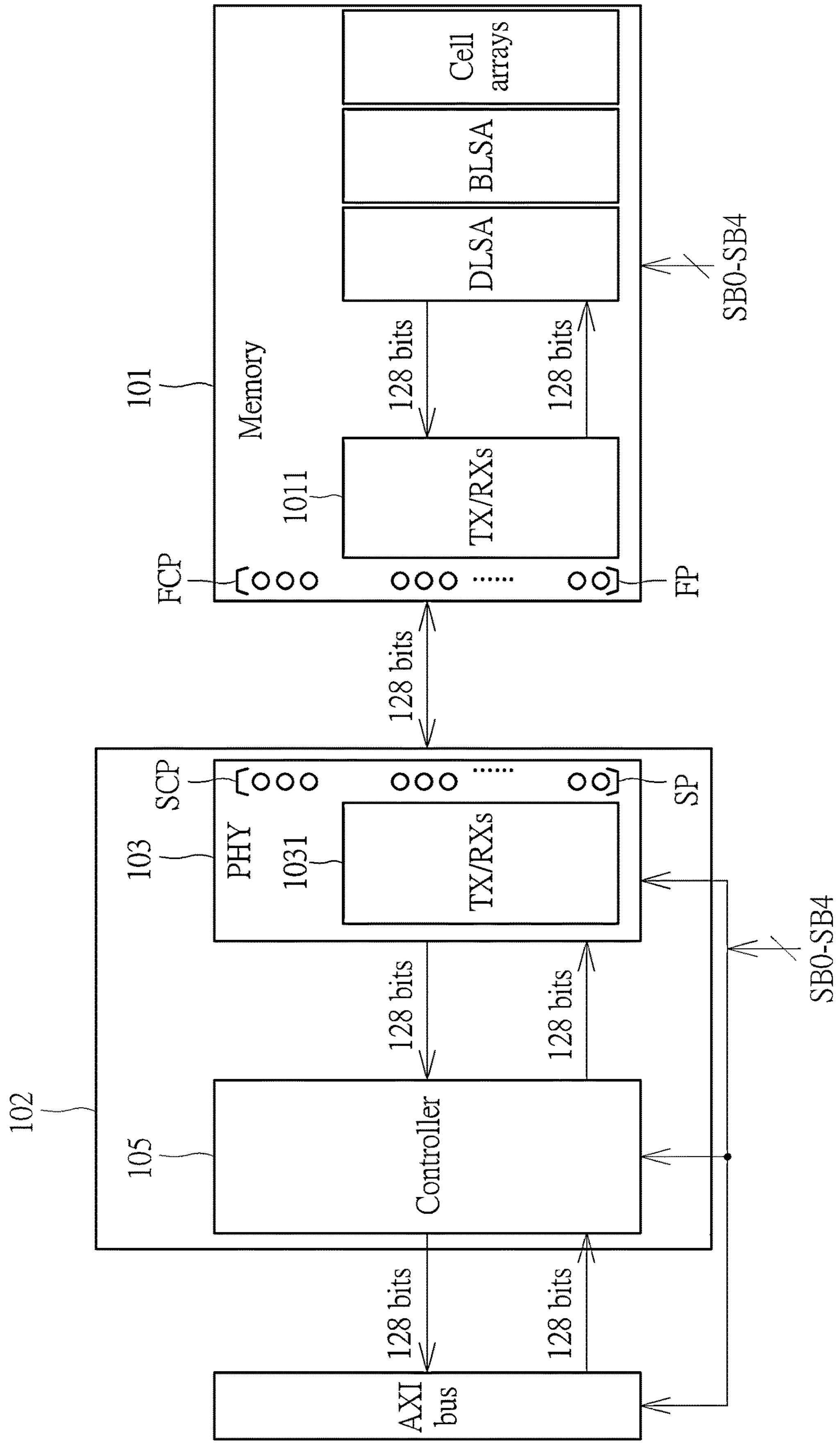
FIG. 9 is a diagram illustrating a data width of the Thunder Array being changed by control signals according to one embodiment of the present invention.

On the other hand, in the present Thunder Array, as shown in FIG. 9, the serial-to-parallel circuit 23 and the parallel-to-serial circuit 22 in DRAM omitted (that are is, there is no serial-to-parallel circuit 23 and parallel-to-serial circuit 22 in DRAM). The memory 101 includes M second sensing amplifiers BLSA (i.e. bit line sensing amplifiers) and N first sensing amplifiers DLSA (i.e. data line sensing amplifiers), wherein a connected number of the M second sensing amplifiers BLSA electrically coupled to the first sensing amplifiers DLSA can be changed by control signals (such as OSB0-SB4 according to TABLE 5), the second sensing amplifiers BLSA are between the cell arrays and the first sensing amplifiers DLSA, the first sensing amplifiers are between the second sensing amplifiers BLSA and the first align circuit 1011 which includes the plurality of transceivers, the first align circuit 1011 is between the first sensing amplifiers DLSA and an I/O data bus of the memory 101, N is a positive integer and not greater than M, and the I/O data bus is coupled to the plurality of first pads FP. In addition, the second sensing amplifiers are connected to bit lines of the memory 101, and the first sensing amplifiers are connected to data lines of the memory 101. The N first sensing amplifiers DLSA are electrically coupled to part of the M second sensing amplifiers BLSA through a plurality of bit switches, and those bit switches could be selected or activated by the aforesaid control signals.

As shown in TABLE 5 and FIG. 9, when the control signals SB0-SB4 are 0/0/0/0/1, 128 second sensing amplifiers are electrically coupled to 128 first sensing amplifiers through bit switches (not shown in FIG. 9, a group of selected bit switches, such as 128 or less bit switches based on ONE given column address, are selected by the control signals SB0-SB4 (0/0/0/0/1)), so 128 bits data can be read from the cell arrays of the memory 101 through part of the second sensing amplifiers and the first sensing amplifiers (such as through the 128 connected second sensing amplifiers and the 128 first sensing amplifiers), or written into the cell arrays of the memory 101 by the first align circuit 1011 through part of the second sensing amplifiers and the first sensing amplifiers (such as through the 128 connected second sensing amplifiers and the 128 first sensing amplifiers). That is, when the 128 bits data are read from the cell arrays of the memory 101, the plurality of transceivers of the first align circuit 1011 parallelly receive and transmit (or simultaneously transmit) the 128 bits data from the 128 first sensing amplifiers to the I/O data bus of the memory 101, or when the 128 bits data are written into the cell arrays of the memory 101, the plurality of transceivers of the first align circuit 1011 parallelly receive and transmit (or simultaneously transmit) the 128 bits data from the I/O data bus to the 128 first sensing amplifiers. Or in other words, when the 128 bits data are read from the cell arrays of the memory 101, part of the second sensing amplifiers BLSA (such as the 128 connected second sensing amplifiers) output the 128 bits data to the first sensing amplifiers DLSA (such as the 128 first sensing amplifiers) which then parallelly output the 128 bits data to the plurality of transceivers, or when the 128 bits data are written into the cell arrays of the memory 101, the 128 first sensing amplifiers parallelly output the 128 bits data to part of the connected second plurality of sensing amplifiers (such as the 128 first sensing amplifiers BLSA). In addition, a data width of the memory 101 (i.e. a width of the I/O data bus of the memory 101) is equal to 128 according to the 128 first sensing amplifiers. Meanwhile, because the data width of the memory 101 is equal to 128, both a data width of the controller 105 and the data width of the AXI bus are equal to 128.

In another embodiment of the present invention, a read (or write) data width of the DFI bus coupled to physical layer 103 are also equal or set to 128 according to the control signals SB0-SB4. In addition, as shown in FIG. 9, when the logic circuit 102 is included in a computing system with a system bus interface (i.e. the AXI bus) which includes a read data bus and a write data bus, both a width of the read data bus and a width of the write data bus are equal to 128 according to the control signals SB0-SB4 (0/0/0/0/1) inputted to the controller 105. In addition, a width of the DFI bus is selectively adjusted according to the control signals SB0-SB4 (0/0/0/0/1) inputted to the physical layer 103.

Similarly, as shown in TABLE 5 and FIG. 9, when the control signals SB0-SB4 are 0/0/0/I/O, 256 second sensing amplifiers of the M second sensing amplifiers are electrically coupled to 256 first sensing amplifiers through another group of selected bit switches (such as 256 or less bit switches based on ONE given column address), so the data width of the memory 101 is limited to be equal to 256 according to the 256 first sensing amplifiers; when the control signals SB0-SB4 are 0/0/0/1/1, 512 second sensing amplifiers of the M sensing amplifiers are electrically coupled to 512 first sensing amplifiers through other selected bit switches (such as 512 or less bit switches based on ONE given column address), so the data width of the memory 101 is limited to be equal to 512 according to the 512 first sensing amplifiers; when the control signals SB0-SB4 are 0/0/1/0/0, 1024 second sensing amplifiers of the M second sensing amplifiers are electrically coupled to 1024 first sensing amplifiers through other selected bit switches (such as 1024 or less bit switches based on ONE given column address), so the data width of the memory 101 is limited to be equal to 1024 according to the 1024 first sensing amplifiers; and when the control signals SB0-SB4 are 0/0/0/0/0, 64 second sensing amplifiers of the M second sensing amplifiers are electrically coupled to 64 first sensing amplifiers through selected bit switches (such as 64 or less bit switches based on ONE given column address), so the data width of the memory 101 is limited to be equal to 64 according to the 64 first sensing amplifiers. In addition, the present invention is not limited to the memory 101 including the M second sensing amplifiers and configurations of the control signals SB0-SB4 shown in FIG. 9. In addition, the present invention is also not limited to a number of the control signals SB0-SB4, that is, the present invention can have a number of control signals less than or more than the number of the control signals SB0-SB4.

TABLE 5

| SB4/SB3/SB2/SB1/SB0 | The data width of the memory 101 | The data width of the controller 105 | The data width of the AXI bus |
|---|---|---|---|
| 0/0/1/0/0 | 1024 | 1024 | 1024 |
| 0/0/0/1/1 | 512 | 512 | 512 |
| 0/0/0/1/0 | 256 | 256 | 256 |
| 0/0/0/0/1 | 128 | 128 | 128 |
| 0/0/0/0/0 | 64 | 64 | 64 |

Figure 10:
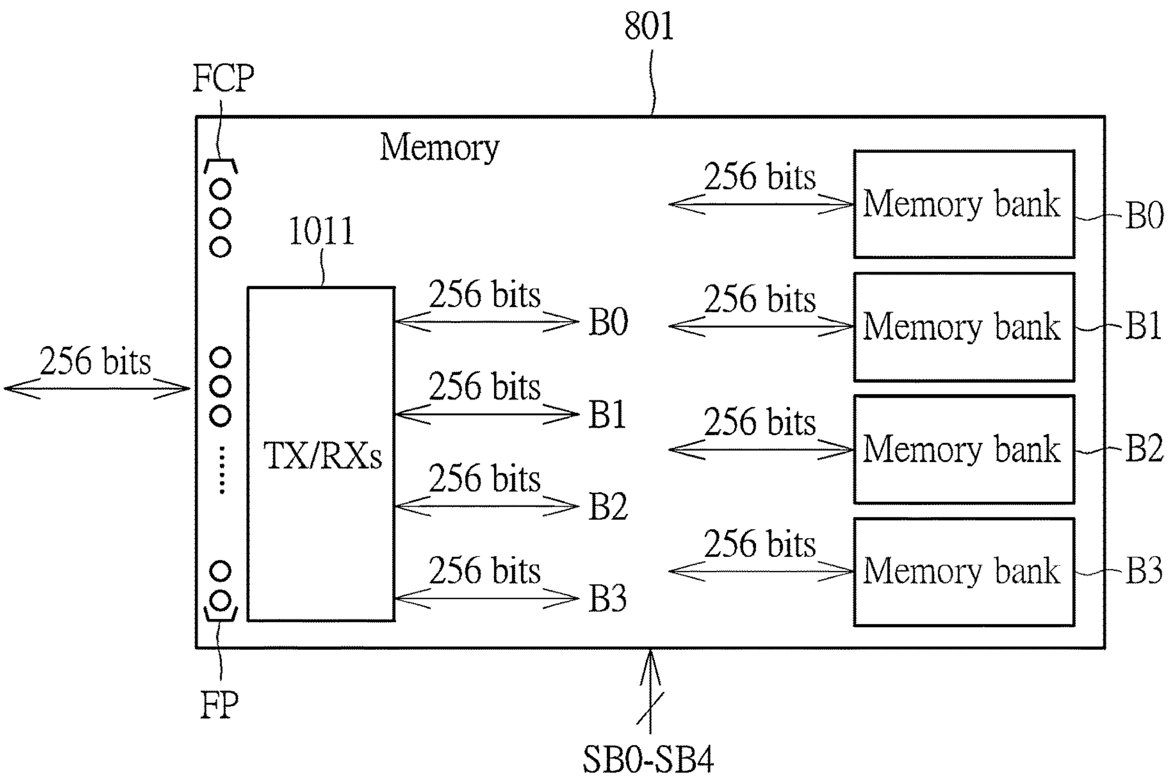
FIG. 10 and FIG. 11 are diagrams illustrating different Thunder Arrays according to different embodiments of the present invention.

Please refer to FIG. 10. FIG. 10 is a diagram illustrating a memory 801 according to another embodiment of the present invention, wherein a difference between the memory 801 and the memory 101 is that the memory 801 includes 4 memory banks B0-B4, each memory bank of the memory banks B0-B4 is just the cell arrays of the memory 101. But, the present invention is not limited to the memory 801 including the 4 memory banks B0-B4 (that is, the memory 801 can include a plurality of memory banks). In addition, for simplicity, the M second sensing amplifiers BLSA and the N first sensing amplifiers DLSA are not shown in FIG. 10.

As shown in TABLE 6 and FIG. 10, when the control signals SB0-SB4 are 0/0/0/I/O, 256 second sensing amplifiers of a specific memory bank of the memory 801 could be electrically coupled to 256 first sensing amplifiers by the control signals SB0-SB4, so 256 bits data can be read from the specific memory bank of the memory 801 by the first align circuit 1011 through the 256 connected second sensing amplifiers and the 256 first sensing amplifiers, or written into the specific memory bank of the memory 801 by the first align circuit 1011 through the 256 connected second sensing amplifiers and the 256 first sensing amplifiers. The specific memory bank of the memory 801 could be selected by another signal, such as bank selected signals. That is, as shown in TABLE 6, a data width of the selected memory bank of the memory 801 could be adjusted to be equal to 256 according to the 256 first sensing amplifiers. In addition, because the 4 memory banks B0-B4 are independent of each other, a data width of the memory 801 (i.e. a width of the I/O data bus of the memory 801) is also equal to 256. In addition, in another embodiment both the data width of the controller 105 and the data width of the DFI bus are equal to 256 according to the control signals SB0-SB4 (0/0/0/1/0)

In addition, other data widths of the each memory bank of the memory 801 and other data widths of the memory 801 corresponding to the control signals SB0-SB4 (0/0/1/0/0), (0/0/0/1/1), (0/0/0/0/1), (0/0/0/0/0) can be referred to TABLE 6, so further descriptions thereof are omitted for simplicity. In addition, the present invention is not limited to configurations of the control signals SB0-SB4 shown in FIG. 10.

TABLE 6

| SB4/SB3/SB2/SB1/SB0 | The data width of the AXI bus | The data width of the each memory bank | The data width of the memory 801 |
|---|---|---|---|
| 0/0/1/0/0 | 1024 | 1024 | 1024 |
| 0/0/0/1/1 | 512 | 512 | 512 |
| 0/0/0/1/0 | 256 | 256 | 256 |
| 0/0/0/0/1 | 128 | 128 | 128 |
| 0/0/0/0/0 | 64 | 64 | 64 |

Figure 11:
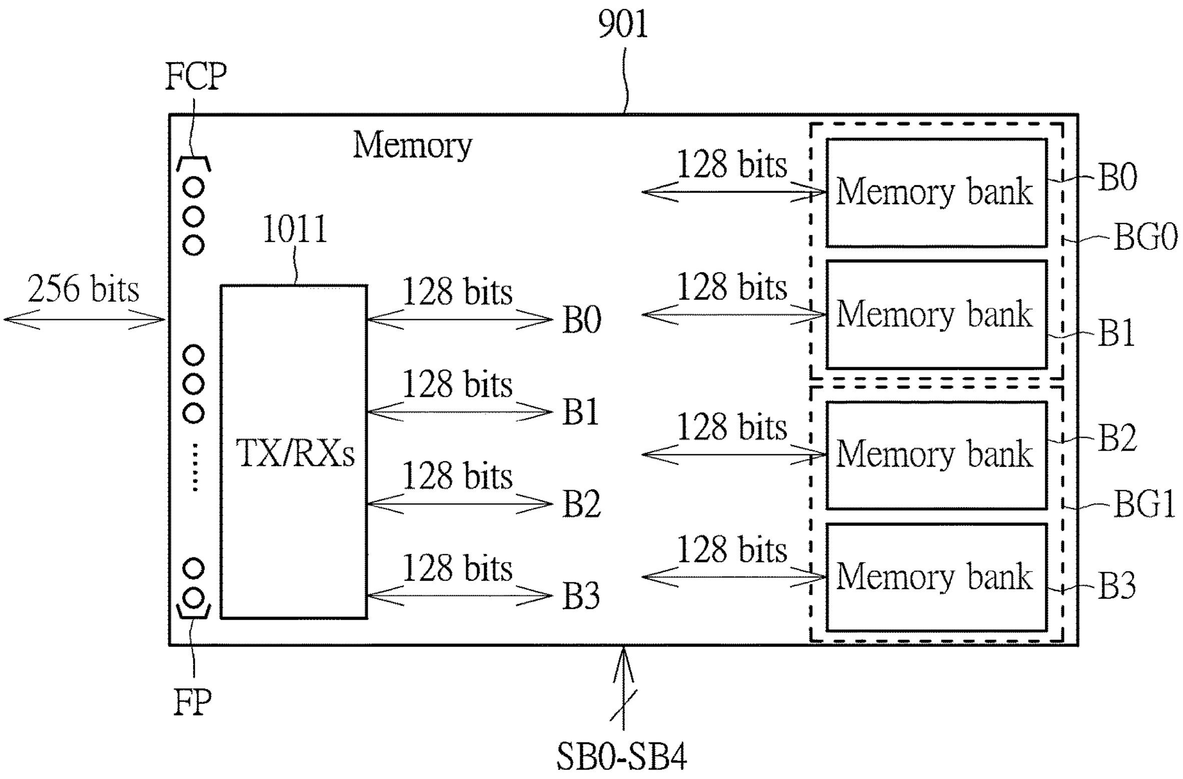

Please refer to FIG. 11. FIG. 11 is a diagram illustrating a memory 901 according to another embodiment of the present invention, wherein a difference between the memory 901 and the memory 801 is that the memory banks B0, B1 are included in a bank group BG0, and the memory banks B2, B3 are included in a bank group BG1. But, the present invention is not limited to the bank group BG0 including the memory banks B0, B1, and the bank group BG1 including the memory banks B2, B3. For example, all banks B0, B1, B2, B3 could be grouped as a bank group BGX.

Taking the bank group BG0 as an example, a first set of sensing amplifiers coupled to the data lines and a second set of sensing amplifiers coupled to the data lines, wherein the first set of sensing amplifiers corresponds to the memory bank B0 and is configured to parallelly output a first plurality of data, the second set of sensing amplifiers corresponds to the memory bank B1 and configured to parallelly output a second plurality of data, and the first set of sensing amplifiers and the second set of sensing amplifiers are just the previously mentioned first sensing amplifiers (that is, DLSA). In addition, a third set of sensing amplifiers is coupled to the bit lines and configured between the memory bank B0 and the first set of sensing amplifiers, and a fourth set of sensing amplifiers coupled to the bit lines and configured between the memory bank B1 and the second set of sensing amplifiers, wherein the third set of sensing amplifiers and the fourth set of sensing amplifiers are just the previously mentioned second sensing amplifiers (that is, BLSA).

Therefore, as shown in TABLE 7 and FIG. 11, when the control signals SB0-SB4 are 0/1/0/1/0, 128 second sensing amplifiers corresponding to each memory bank of a specific bank group (e.g. the bank group BG0) are electrically coupled to 128 first sensing amplifiers corresponding to the each memory bank of the specific bank group by the control signals SB0-SB4, so 256 bits data can be read from the specific bank group by the first align circuit 1011 through 256 connected second sensing amplifiers and 256 first sensing amplifiers (because the first align circuit 1011 can read 128 bits data of the 256 bits data from one memory bank of the specific bank group through 128 connected second sensing amplifiers and 128 first sensing amplifiers corresponding to the one memory bank, and read other 128 bits data of the 256 bits data from another memory bank of the specific bank group through other 128 connected second sensing amplifiers and other 128 first sensing amplifiers corresponding to the another memory bank), or the 256 bits data can be written into the specific bank group by the first align circuit 1011 through the 256 connected second sensing amplifiers and the 256 first sensing amplifiers (because the first align circuit 1011 can write the 128 bits data of the 256 bits data to the one memory bank of the specific bank group through the 128 connected second sensing amplifiers and the 128 first sensing amplifiers corresponding to the one memory bank, and write the other 128 bits data of the 256 bits data to the another memory bank of the specific bank group through the other 128 connected second sensing amplifiers and the other 128 first sensing amplifiers corresponding to the another memory bank). That is, as shown in TABLE 7, a data width of each memory bank of the specific bank group are limited to be equal to 128 according to the 128 first sensing amplifiers. In addition, because the memory banks B0, B1 are included in the bank group BG0, a data width of the memory 901 (i.e. a width of the I/O data bus of the memory 901) is equal to a sum (i.e. 128+128=256) of data width of all memory banks of the specific bank group. And the available banks will be reduced to half, as compared to FIG. 10.

In addition, other data widths of the each memory bank of the memory 901 and other data widths of the memory 901 corresponding to the control signals SB0, SB1 (0/1/0/0/0), (0/1/0/0/1), (0/1/0/1/1), (0/0/0/0/0) can be referred to TABLE 7, so further descriptions thereof are omitted for simplicity. In addition, the present invention is not limited to configurations of the control signals SB0-SB4 shown in FIG. 11.

TABLE 7

| SB4/SB3/SB2/SB1/SB0 | The data width of the AXI bus | The data width of the memory 801 | The data width of the each memory bank |
|---|---|---|---|
| 0/1/0/0/0 | 1024 | 1024 | 512 |
| 0/1/0/0/1 | 512 | 512 | 256 |
| 0/1/0/1/0 | 256 | 256 | 128 |
| 0/1/0/1/1 | 128 | 128 | 64 |
| 0/0/0/0/0 | 64 | 64 | 32 |

In summary, the SRAM speed comparable Thunder Array DRAM with wide I/O bus is provided. The RC time constant for the Bitline is reduced to 1/9~1/16, and the RC time constant for the Wordline is at least reduced to 1/6~1/12, as compared with the conventional DRAM made by tens nm technology node (such as 15~28 nm technology node). Thus, the signals in Bitline and Wordline could be developed more and transmitted faster, and the voltage swing for the signals in Bitline and Wordline could be reduced accordingly. The refresh cycle time, write cycle time, or read cycle time of the Thunder Array DRAM structure is less than 5 ns. Moreover, the power consumption of the DRAM could be dramatically improved due to the reduction of the capacitance for Bitline and Wordline and the reduction of the voltage swing for the signals in Bitline and Wordline.

Although the present invention has been illustrated and described with reference to the embodiments, it is to be understood that the invention is not to be limited to the disclosed embodiments, but on the contrary, is intended to cover various modifications and equivalent arrangements included within the spirit and scope of the appended claims.

What is claimed is:

1. A DRAM structure comprising:

a semiconductor substrate with a top surface;

a plurality of DRAM cells, each DRAM cell comprising an access transistor and a storage capacitor;

a Bitline with a first terminal extended along the plurality of DRAM cells to a second terminal, and the Bitline coupled to each access transistor of the plurality of DRAM cells;

a sense amplifier coupled to the first terminal of the Bitline; and a local wordline connected to a gate terminal of the access transistor of a first DRAM cell in the plurality of DRAM cells;

wherein a refresh cycle time, a write cycle time, or a read cycle time of the DRAM structure is less than 5 ns.

2. The DRAM structure of claim 1, wherein the refresh cycle time, the write cycle time, or the read cycle time is less than 3 ns.

3. The DRAM structure of claim 1, wherein the Bitline is under the top surface of the semiconductor substrate.

4. A PSRAM structure comprising:

a semiconductor substrate with a top surface;

a plurality of DRAM cells, each DRAM cell comprising an access transistor and a storage capacitor;

a Bitline with a first terminal extended along the plurality of DRAM cells to a second terminal, and the Bitline coupled to each access transistor of the plurality of DRAM cells;

a sense amplifier coupled to the first terminal of the Bitline; and a local wordline connected to a gate terminal of the access transistor of a first DRAM cell in the plurality of DRAM cells;

wherein a refresh cycle time of the PSRAM structure is less than 5 ns.

5. The PSRAM structure of claim 4, wherein the refresh cycle time is less than 3 ns.

6. A DRAM structure comprising:

a memory bank;

an I/O data bus; and a plurality of data line sensing amplifiers electrically coupled to the memory bank and configured to parallelly output a plurality of data;

wherein a width of the I/O data bus is equal to a bit number of the plurality of data parallelly outputted by the plurality of data line sensing amplifiers.

7. The DRAM structure of claim 6, wherein the width of the I/O data bus is programmable.

8. The DRAM structure of claim 6, wherein the width of the I/O data bus is 128~1024 bits.

9. The DRAM structure of claim 6, wherein no serial-to-parallel circuit and/or parallel-to-serial circuit is between the I/O data bus and the plurality of data line sensing amplifiers.

10. The DRAM structure of claim 6, wherein the memory bank comprising a plurality of DRAM cells, each DRAM cell comprising an access transistor and a storage capacitor, the DRAM structure further comprising:

a semiconductor substrate with a top surface;

a Bitline with a first terminal extended along the plurality of DRAM cells to a second terminal, and the Bitline coupled to each access transistor of the plurality of DRAM cells;

a bitline sense amplifier coupled to the first terminal of the Bitline; and a local Wordline connected to a Gate terminal of the access transistor of a first DRAM cell in the plurality of DRAM cells;

wherein the Bitline is under the top surface of the semiconductor substrate.

* * * * *